United States Patent
Morita (10) Patent No.: US 10,139,813 B2
(45) Date of Patent: Nov. 27, 2018

(54) PRODUCTION SEQUENCE OPTIMIZING METHOD AND PRODUCTION SEQUENCE OPTIMIZING SYSTEM

(75) Inventor: Yukitoshi Morita, Okasaki (JP)

(73) Assignee: FUJI CORPORATION, Chiryu (JP)

( * ) Notice: Subject to any disclaimer, the term of this patent is extended or adjusted under 35 U.S.C. 154(b) by 256 days.

(21) Appl. No.: 14/427,410

(22) PCT Filed: Sep. 12, 2012

(86) PCT No.: PCT/JP2012/073353
§ 371 (c)(1),
(2), (4) Date: Mar. 11, 2015

(87) PCT Pub. No.: WO2014/041640
PCT Pub. Date: Mar. 20, 2014

(65) Prior Publication Data
US 2015/0248314 A1    Sep. 3, 2015

(51) Int. Cl.
*G05B 19/418* (2006.01)
*H05K 13/08* (2006.01)
(Continued)

(52) U.S. Cl.
CPC ..... *G05B 19/41865* (2013.01); *G06F 9/4881* (2013.01); *G06F 9/5044* (2013.01);
(Continued)

(58) Field of Classification Search
CPC ............ G06Q 10/06; G06Q 10/06315; G06Q 10/087; G06Q 10/06312; G06F 9/5044;
(Continued)

(56) References Cited

U.S. PATENT DOCUMENTS

| 5,155,679 A * | 10/1992 | Jain ................ G05B 19/41865 |
| | | 700/101 |
| 2004/0143352 A1* | 7/2004 | Gyorfi .................... G06Q 10/06 |
| | | 700/99 |
| 2009/0062951 A1 | 3/2009 | Awata |

FOREIGN PATENT DOCUMENTS

JP        2003 46296       2/2003

OTHER PUBLICATIONS

William Edward Swaim, "SMT Line Improvements for High Mix, Low Volume Electronics Manufacturing" Graduate Faculty of Auburn University, Degree of Masters of Science, XP055200759. Aug. 6, 2011, 86 Pages.

(Continued)

*Primary Examiner* — Robert E Fennema
*Assistant Examiner* — Shon G Foley
(74) *Attorney, Agent, or Firm* — Oblon, McClelland, Maier & Neustadt, L.L.P.

(57) ABSTRACT

A production sequence optimizing method and a production sequence optimizing system that can reduce downtime caused by a setup operation. The production sequence optimizing method classifies a plurality of production programs which are continuously executed using a production line into a plurality of groups which share resources used for production and optimizes an execution order of the plurality of production programs. The production sequence optimizing method includes: a resource number counting step of counting the number of all resources held in stock; and a resource allocation step of allocating the resources to each of the groups on the basis of the number of all resources, the number of resources required for an N-th group, and the number of resources required for an (N+1)-th group.

14 Claims, 9 Drawing Sheets

(51) Int. Cl.
    *G06F 9/48* (2006.01)
    *G06F 9/50* (2006.01)
(52) U.S. Cl.
    CPC ... *H05K 13/08* (2013.01); *G05B 2219/32264* (2013.01); *G05B 2219/32283* (2013.01); *G05B 2219/32291* (2013.01); *G05B 2219/32298* (2013.01); *G05B 2219/45026* (2013.01); *Y02P 90/04* (2015.11); *Y02P 90/12* (2015.11); *Y02P 90/20* (2015.11)
(58) Field of Classification Search
    CPC .......... G06F 9/4881; H05K 13/08; G05B 19/41865; G05B 2219/45026; G05B 2219/32291; G05B 2219/322; Y02P 90/12; Y02P 90/04; Y02P 90/20
    USPC .......................................... 700/99
    See application file for complete search history.

(56) References Cited

OTHER PUBLICATIONS

Kari Salonen, "Setup Optimization in High-Mix Surface Mount PCB Assembly" Turku Centre for Computer Science, TUCS Dissertations, No. 109, XP055200719, Oct. 2008, 72 Pages.
International Search Report dated Nov. 20, 2012 in PCT/JP12/073353 Filed Sep. 12, 2012.

* cited by examiner

| FEEDER | GROUP 1 | GROUP 2 | GROUP 3 | GROUP 4 |
|---|---|---|---|---|
| #1 | 5 0 | 8 0 ( 3 0 ) | 4 0 ( 2 0 ) | 9 0 ( 3 0 ) |
| #2 | ... | ... | ... | ... |

F I G. 6

| FEEDER | GROUP 1 | GROUP 2 | GROUP 3 | GROUP 4 |
|---|---|---|---|---|
| #1 | 50 | 50 | 30 | 70 |
| #2 | ... | ... | ... | ... |

F I G. 7

| NOZZLE | GROUP 1 | GROUP 2 | GROUP 3 | GROUP 4 |
|---|---|---|---|---|
| #1 | 25 | 25 | 20 | 30 |
| #2 | ... | ... | ... | ... |

PRODUCTION SEQUENCE OPTIMIZING METHOD AND PRODUCTION SEQUENCE OPTIMIZING SYSTEM

TECHNICAL FIELD

The present invention relates to a production sequence optimizing method and a production sequence optimizing system that optimize the execution order of a plurality of production programs used to produce a board.

BACKGROUND ART

In a production line, a plurality of types of boards are continuously produced. The production sequence of respective boards, that is, the execution order of a production program is determined by an editing application in a production planning phase.

When the type of board to be produced is changed, a setup operation is performed. That is, the number and the type of resources, such as feeders or nozzles vary depending on the type of board. Therefore, in the setup operation, the resources are replaced.

CITATION LIST

Patent Literature

PTL 1: JP-A-2003-46296

BRIEF SUMMARY

Technical Problem

However, in the related art, the editing application determines the execution order of the production programs, without considering the number of resources held in stock. Therefore, in some cases, it takes a lot of time for the setup operation.

Hereinafter, it is assumed that seven types of electronic components are mounted on a first type of board and then eight types of electronic components are mounted on a second type of board. In addition, it is assumed that two types of electronic components are common to the two types of boards. Furthermore, it is assumed that there are 10 feeders held in stock.

The electronic components are arranged on a tape. The tape is replaceably mounted in the feeder. When the first type of board is produced, that is, when the first production program is executed, seven feeders are required. When the second type of board is produced, that is, when the second production program is executed, eight feeders are required. Here, two feeders can be used in common. Therefore, in the setup operation, among the eight feeders used by the second production program, it is necessary to newly arrange six feeders except for two feeders which can be used in common.

In order to reduce the time required for the setup operation, it is preferable that tapes (electronic components) for the second production program be mounted in six feeders in advance outside the production line while the first production program is being executed.

However, only three feeders (=10−7) are not used while the first production program is being executed. That is, the tapes can be mounted only in three feeders in advance outside the production line. For the remaining three feeders, the three feeders which have been used by the first production program need to be used after the first production program ends. That is, it is necessary to detach the three feeders from an electronic component mounting machine, to replace the tapes (electronic components) for each feeder, and to attach the feeders to the electronic component mounting machine again. Therefore, downtime caused by the setup operation increases.

As such, when the editing application determines the execution order of the production programs, without considering the number of resources held in stock, in some cases, downtime caused by the setup operation increases.

In order to solve the problems, paragraphs [0097] and [0098] of PTL 1 disclose a method which adjusts the number of cassettes used by a single production program, depending on the number of cassettes held in stock. However, the method disclosed in PTL 1 does not assume the use of a plurality of production programs. Therefore, PTL 1 does not disclose and suggest the problem regarding a lack of resources between successive production programs.

Accordingly, an object of the present disclosure is to provide a production sequence optimizing method and a production sequence optimizing system which can reduce downtime caused by a setup operation.

Solution to Problem (1) In order to solve the above-mentioned problems, a production sequence optimizing method according to the present disclosure classifies a plurality of production programs which are continuously executed using a production line into a plurality of groups which share resources used for production and optimizes an execution order of the plurality of production programs. The production sequence optimizing method includes: a resource number counting step of counting the number of all the resources held in stock; and a resource allocation step of allocating the resources to each of the groups on the basis of the number of all the resources, the number of resources required for an N-th (N is a natural number) group, and the number of resources required for an (N+1)-th group. Here, one or a plurality of production programs may be included in any one group.

According to the production sequence optimizing method of the present disclosure, it is possible to optimize the execution order of a plurality of production programs considering the number of resources held in stock. That is, when production is switched from the N-th group to the (N+1)-th group, the resources are allocated to each group such that the setup operation is performed outside the production line if possible. Therefore, the production sequence optimizing method according to the present disclosure can reduce downtime caused by the setup operation.

(2) In the structure according to (1), preferably, the resource may be a feeder in which a tape having electronic components arranged thereon is detachably provided and which is detachably provided in an electronic component mounting machine. When the feeders are individually replaced in the electronic component mounting machine in a setup operation, the feeders may be allocated to each of the groups in the resource allocation step, using the following Expression (1):

$$X0 - X1 + X3 \geq X2 \qquad \text{Expression (1)}$$

(where $X0$ is the number of all feeders, $X1$ is the number of feeders required for the N-th (N is a natural number) group, $X2$ is the number of feeders required for the (N+1)-th group, and $X3$ is the number of feeders shared by the N-th group and the (N+1)-th group).

According to this structure, when the feeders are individually replaced in the electronic component mounting machine, it is possible to reduce downtime caused by the setup operation.

(3) In the structure according to (1), preferably, the resource may be a feeder in which a tape having electronic components arranged thereon is detachably provided and which is detachably provided in an electronic component mounting machine. When the feeders are collectively replaced in the electronic component mounting machine in a setup operation, the feeders may be allocated to each of the groups in the resource allocation step, using the following Expression (2):

$$X1+X2 \leq X0 \qquad \text{Expression (2)}$$

(where X0 is the number of all feeders, X1 is the number of feeders required for the N-th (N is a natural number) group, and X2 is the number of feeders required for the (N+1)-th group).

According to this structure, when the feeders are collectively replaced in the electronic component mounting machine, it is possible to reduce downtime caused by the setup operation.

(4) In the structure according to any one of (1) to (3), preferably, the resource may be a nozzle which is detachably provided in the electronic component mounting machine and transfers the electronic component. The nozzles may be allocated to each of the groups in the resource allocation step, using the following Expression (3):

$$Y1+Y2 \leq Y0 \qquad \text{Expression (3)}$$

(where Y0 is the number of all nozzles, Y1 is the number of nozzles required for the N-th (N is a natural number) group, and Y2 is the number of nozzles required for the (N+1)-th group).

According to this structure, when the nozzles are replaced in the electronic component mounting machine, it is possible to reduce downtime caused by the setup operation.

(5) In the structure according to any one of (1) to (4), preferably, the production sequence optimizing method may further include a reference optimization step of allocating the resources to the production program with the highest priority among the plurality of production programs such that a cycle time is shortened before the resource allocation step.

According to this structure, it is possible to allocate the resource to the production program with the highest priority. The resource is a reference when the resources are allocated to each group in the resource allocation step which is the subsequent step.

(6) In order to solve the above-mentioned problems, a production sequence optimizing system according to the present disclosure includes: a production line; and a control device that classifies a plurality of production programs which are continuously executed using the production line into a plurality of groups which share resources used for production and optimizes an execution order of the plurality of production programs. The control device performs: a resource number counting step of counting the number of all the resources held in stock; and a resource allocation step of allocating the resources to each of the groups on the basis of the number of all the resources, the number of resources required for an N-th (N is a natural number) group, and the number of resources required for an (N+1)-th group. Here, one or a plurality of production programs may be included in any one group.

Similarly to the structure according to (1), according to the production sequence optimizing system of the present disclosure, it is possible to optimize the execution order of a plurality of production programs considering the number of resources held in stock. That is, when production is switched from the N-th group to the (N+1)-th group, the resources are allocated to each group such that the setup operation is performed outside the production line if possible. Therefore, the production sequence optimizing method according to the present disclosure can reduce downtime caused by the setup operation.

(7) In the structure according to (6), preferably, the production line may include an electronic component mounting machine that puts electronic components on a board. The resource may be a feeder in which a tape having electronic components arranged thereon is detachably provided and which is detachably provided in the electronic component mounting machine. When the feeders are individually replaced in the electronic component mounting machine in a setup operation, the control device may allocate the feeders to each of the groups in the resource allocation step, using the following Expression (1):

$$X0-X1+X3 \geq X2 \qquad \text{Expression (1)}$$

(where X0 is the number of all feeders, X1 is the number of feeders required for the N-th (N is a natural number) group, X2 is the number of feeders required for the (N+1)-th group, and X3 is the number of feeders shared by the N-th group and the (N+1)-th group).

Similarly to the structure according to (2), according to this structure, when the feeders are individually replaced in the electronic component mounting machine, it is possible to reduce downtime caused by the setup operation.

(8) In the structure according to (6), preferably, the production line may include an electronic component mounting machine that puts electronic components on a board. The resource may be a feeder in which a tape having electronic components arranged thereon is detachably provided and which is detachably provided in the electronic component mounting machine. When the feeders are collectively replaced in the electronic component mounting machine in a setup operation, the control device may allocate the feeders to each of the groups in the resource allocation step, using the following Expression (2):

$$X1+X2 \leq X0 \qquad \text{Expression (2)}$$

(where X0 is the number of all feeders, X1 is the number of feeders required for the N-th (N is a natural number) group, and X2 is the number of feeders required for the (N+1)-th group).

Similarly to the structure according to (3), according to this structure, when the feeders are collectively replaced in the electronic component mounting machine, it is possible to reduce downtime caused by the setup operation.

(9) In the structure according to any one of (6) to (8), preferably, the production line may include an electronic component mounting machine that puts electronic components on a board. The resource may be a nozzle which is detachably provided in the electronic component mounting machine and transfers the electronic components. The control device may allocate the nozzles to each of the groups in the resource allocation step, using the following Expression (3):

$$Y1+Y2 \leq Y0 \qquad \text{Expression (3)}$$

(where Y0 is the number of all nozzles, Y1 is the number of nozzles required for the N-th (N is a natural number) group, and Y2 is the number of nozzles required for the (N+1)-th group).

Similarly to the structure according to (4), according to this structure, when the nozzles are replaced in the electronic component mounting machine, it is possible to reduce downtime caused by the setup operation.

(10) In the structure according to anyone of (6) to (9), preferably, the control device may perform a reference optimization step of allocating the resources to the production program with the highest priority among the plurality of production programs such that a cycle time is shortened before the resource allocation step.

Similarly to the structure according to (5), according to this structure, it is possible to allocate the resource to the production program with the highest priority. The resource is a reference when the resources are allocated to each group in the resource allocation step which is the subsequent step.

Advantageous Effects

According to the present disclosure, it is possible to provide a production sequence optimizing method and a production sequence optimizing system that can reduce downtime caused by a setup operation.

REFERENCE SIGNS LIST

1a TO 1d: ELECTRONIC COMPONENT MOUNTING MACHINE
2: BASE 3: MODULE, 30: BOARD TRANSFER UNIT, 300: WALL PORTION, 301: CONVEYER BELT, 31: XY ROBOT, 310: Y-DIRECTION SLIDER, 311: X-DIRECTION SLIDER, 312: Y-DIRECTION GUIDE RAIL, 313: X-DIRECTION GUIDE RAIL, 32: MOUNTING HEAD, 320: NOZZLE, 33: NOZZLE STOCKER, 36: HOUSING
4: COMPONENT SUPPLY DEVICE, 40: TAPE, 41: REEL, 42: FEEDER
5: DEVICE PALLET, 50: SLOT
6: PCU, 60: UNIT BODY, 61: CASTER, 62: HANDLE

8: HOST COMPUTER (CONTROL DEVICE), 80: ARITHMETIC UNIT, 81: STORAGE UNIT, 82: INPUT UNIT, 83: MONITOR
9: PRODUCTION SEQUENCE OPTIMIZING SYSTEM, 90: BOARD F: FLOOR, L: PRODUCTION LINE, N: NETWORK

Description of Embodiments

Hereinafter, embodiments of a production sequence optimizing method and a production sequence optimizing system according to the present disclosure will be described.

<Production Sequence Optimizing System>

Figure 1:
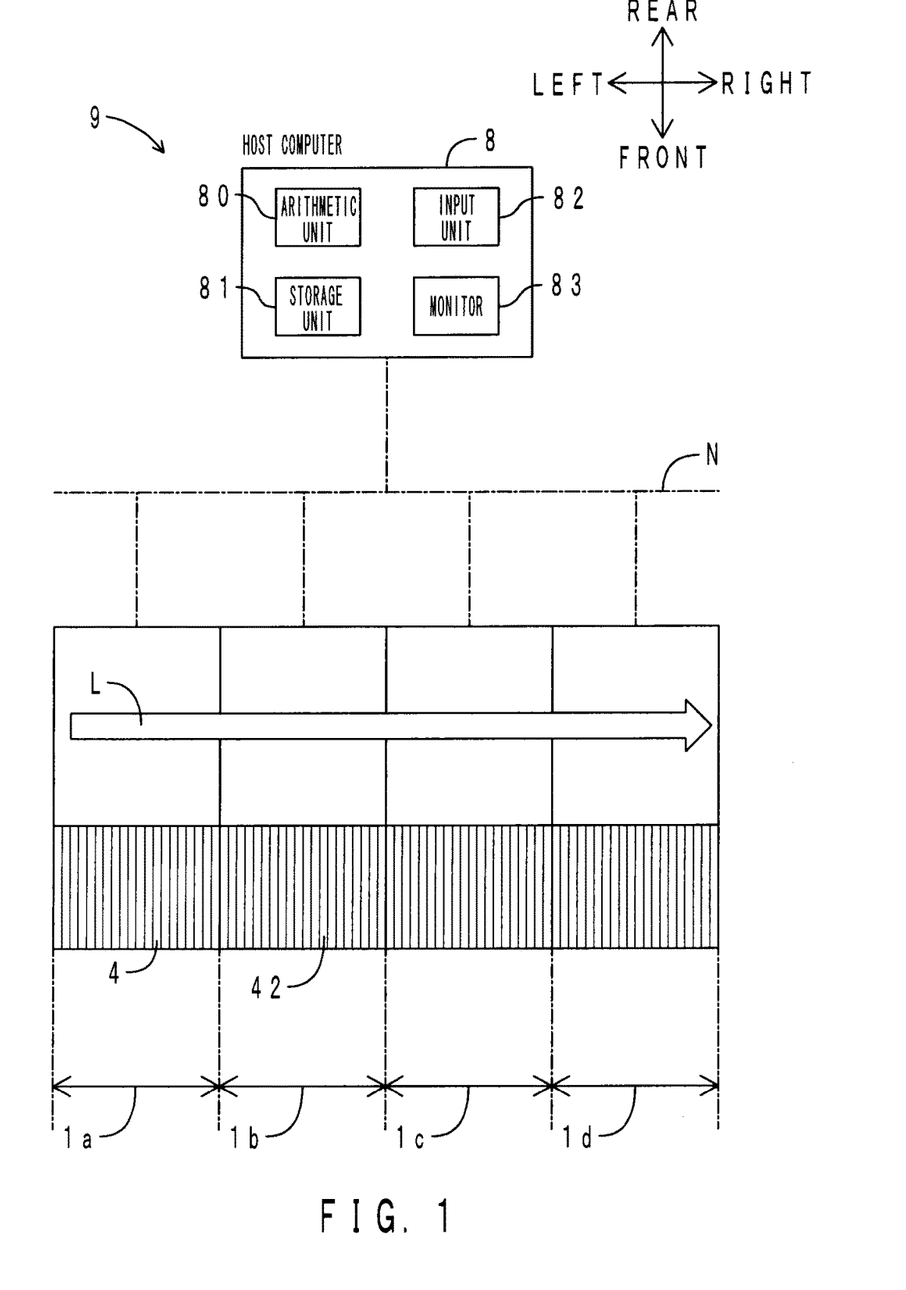
FIG. 1 is a schematic diagram illustrating an embodiment of a production sequence optimizing system according to the present disclosure.

First, the structure of the production sequence optimizing system according to this embodiment will be described. FIG. 1 is a schematic diagram illustrating a production sequence optimizing system according to this embodiment. As shown in FIG. 1, a production sequence optimizing system 9 according to this embodiment includes a production line L and a host computer 8. The host computer 8 includes the concept of a "control device" according to the present disclosure.

[Production Line L]

The production line L includes four electronic component mounting machines 1a to 1d which are arranged in a line. Hereinafter, the structure of the electronic component mounting machine 1a will be described as a representative example of the structure of the four electronic component mounting machines 1a to 1d.

Figure 2:
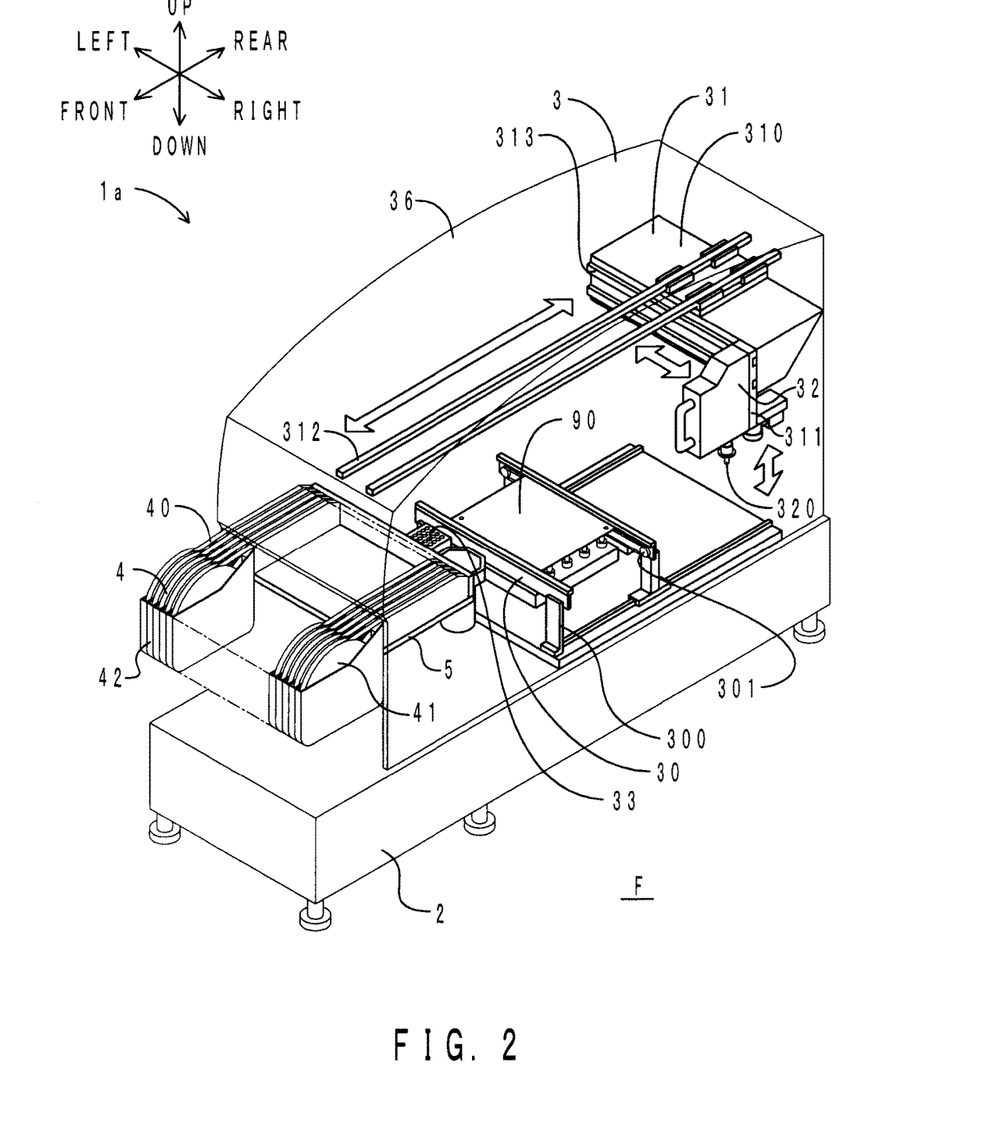
FIG. 2 is a perspective view illustrating an electronic component mounting machine of the production sequence optimizing system.

FIG. 2 is a perspective view illustrating the electronic component mounting machine of the production sequence optimizing system according to this embodiment. A housing 36 is transparently shown. As shown in FIG. 2, the electronic component mounting machine 1a includes a base 2, a module 3, a plurality of component supply devices 4, and a device pallet 5.

The base 2 is arranged on the floor F of a factory. The module 3 is detachably provided on the upper surface of the base 2. The module 3 includes a board transfer unit 30, an XY robot 31, a mounting head 32, a nozzle stocker 33, and the housing 36.

The housing 36 forms the outer shell of the module 3. The board transfer unit 30 includes a pair of front and rear wall portions 300. Conveyer belts 301 are provided on the rear surface of the front wall portion 300 and the front surface of the rear wall portion 300. A board 90 is provided on the pair of front and rear conveyer belts 301.

The XY robot 31 includes a Y-direction slider 310, an X-direction slider 311, a pair of left and right Y-direction guide rails 312, and a pair of upper and lower X-direction guide rails 313.

The pair of left and right Y-direction guide rails 312 are provided on the lower surface of the upper wall of the housing 36. The Y-direction slider 310 is attached to the pair of left and right Y-direction guide rails 312 so as to be slidable in the front-rear direction. The pair of upper and lower X-direction guide rails 313 are provided on the front surface of the Y-direction slider 310. The X-direction slider 311 is attached to the pair of upper and lower X-direction guide rails 313 so as to be slidable in the left-right direction.

The mounting head 32 is attached to the X-direction slider 311. Therefore, the mounting head 32 can be moved in the front-rear direction and the left-right direction by the XY robot 31. A nozzle 320 is attached on the lower side of the mounting head 32 so as to be replaceable.

The nozzle stocker 33 is detachably provided on the front side of the board transfer unit 30. A plurality of nozzles 320 are provided in the nozzle stocker 33. The mounting head 32 can replace the nozzle 320 used in the nozzle stocker 33.

Figure 3:
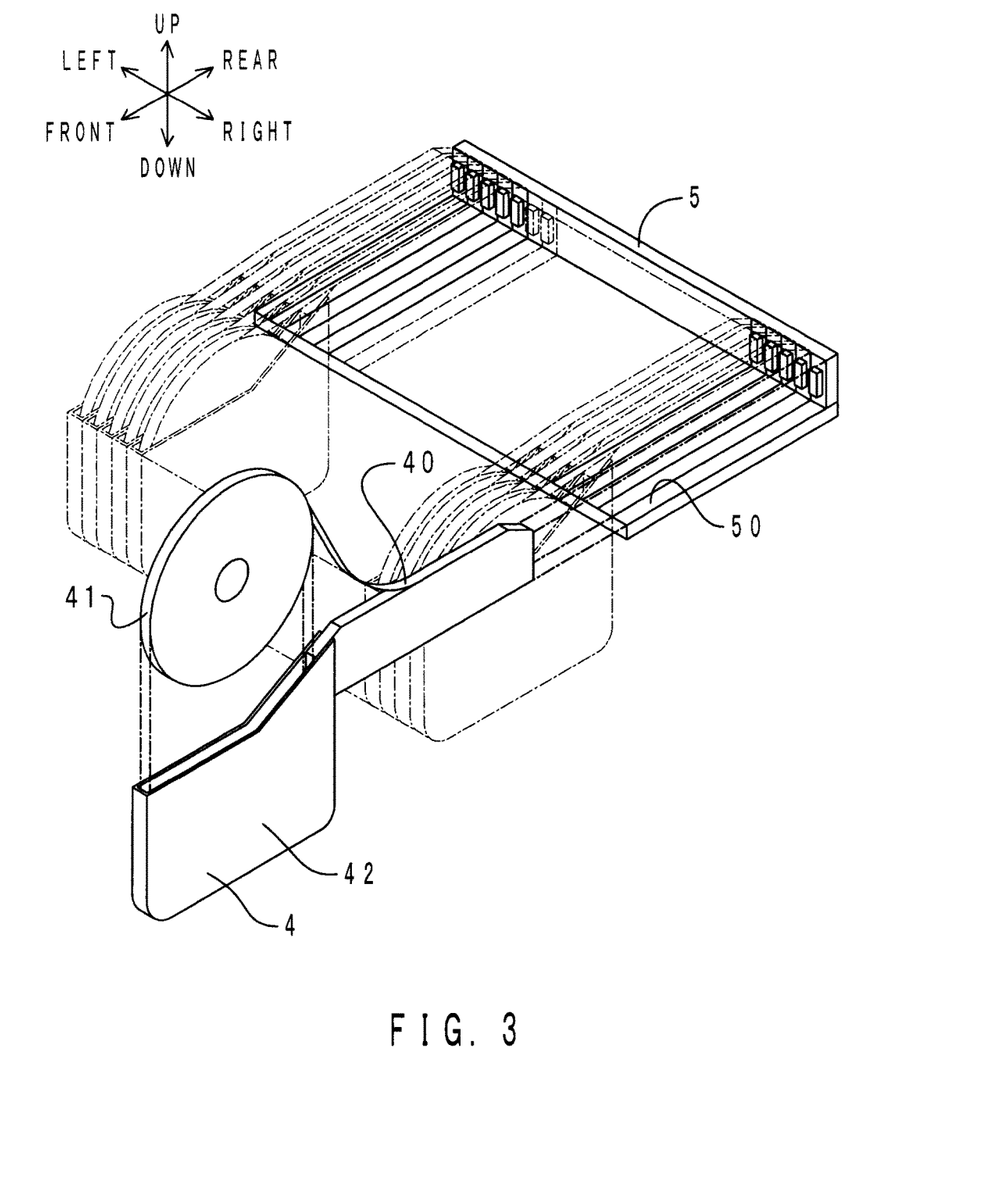
FIG. 3 is a perspective view illustrating a device pallet.

The device pallet 5 is detachably mounted in the front opening of the module 3. FIG. 3 is a perspective view illustrating the device pallet. As shown in FIG. 3, the device pallet 5 includes a plurality of slots 50.

Each of the plurality of component supply devices 4 is attached to the slot 50 so as to be detachable. The component supply device 4 includes a tape 40, a reel 41, and a feeder 42. A plurality of electronic components are arranged on the tape 40 at predetermined intervals in the longitudinal direction. The same type of electronic components are arranged on a single tape 40. The tape 40 is wound around the reel 41. The reel 41 is detachably accommodated in the feeder 42. The leading end of the tape 40 is drawn from the reel 41 to the rear side. The electronic component is picked up from the leading end of the tape 40 with the nozzle 320 shown in FIG. 2. The electronic component which is picked up is transferred to the board 90 by the mounting head 32 and the XY robot 31 and is then mounted at a predetermined mounting position.

[Host Computer 8]

As shown in FIG. 1, the host computer 8 is electrically connected to all of the electronic component mounting machines 1a to 1d through a network N. The host computer 8 includes an arithmetic unit 80, a storage unit 81, an input unit 82, and a monitor 83. The arithmetic unit 80 is a central processing unit (CPU). The storage unit 81 includes a read only memory (ROM) and a random access memory (RAM). The input unit 82 is used by the operator to input instructions to each operating machine provided in the production line L or to input data. The state of the host computer 8 or each operating machine provided in the production line L is displayed on the monitor 83.

<Feeder Replacement Method>

As shown in FIG. 2, as a method for replacing the feeders 42 (that is, the electronic components) in the electronic component mounting machine 1a, there are two methods, that is, a method for individually replacing the feeders 42 and a method for collectively replacing all feeders 42.

As shown in FIG. 3, when the feeders 42 are individually replaced, the feeders 42 are mounted one by one in the slots 50 of the device pallet 5 attached to the electronic component mounting machine 1a.

Figure 4:
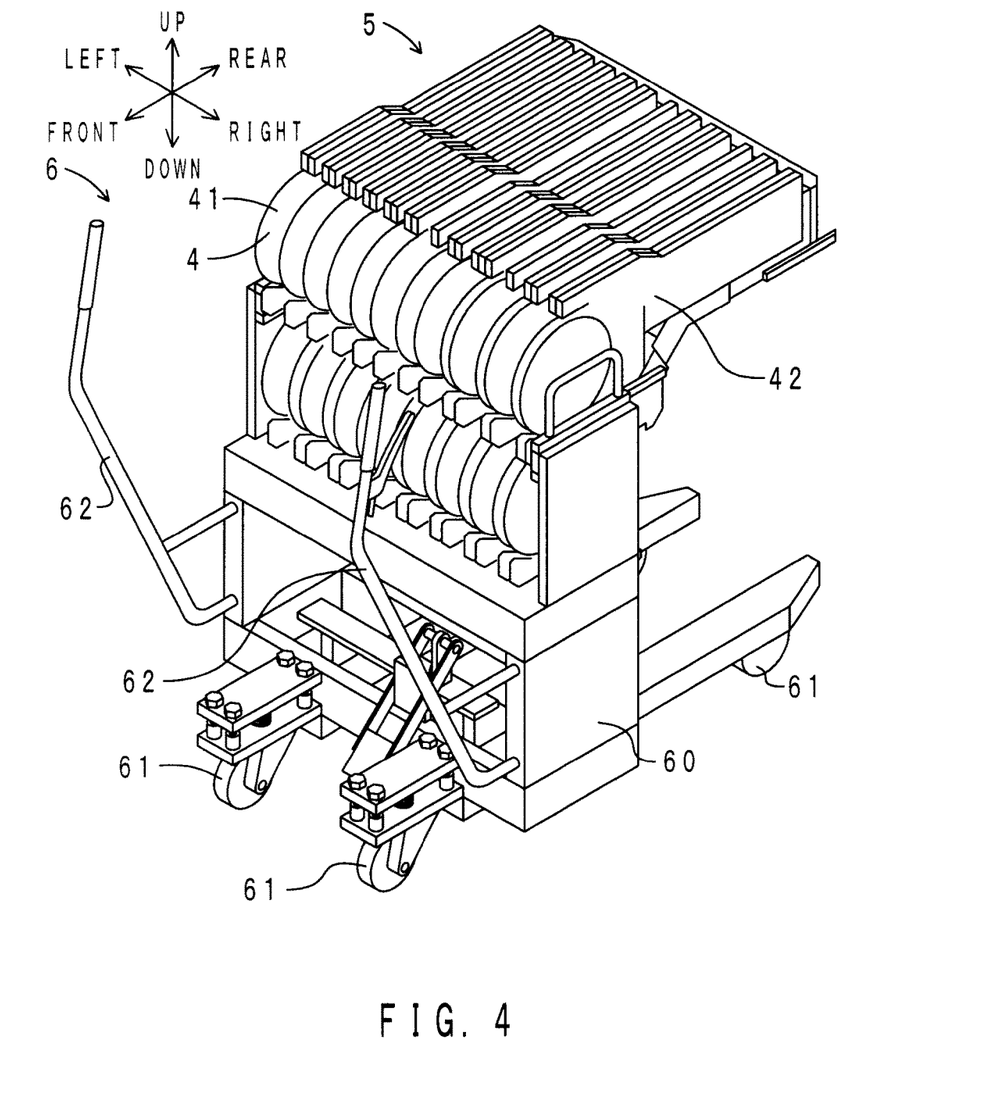
FIG. 4 is a perspective view illustrating a PCU.

When all feeders 42 are collectively replaced, a pallet change unit (PCU) is used. FIG. 4 is a perspective view illustrating the PCU. As shown in FIG. 4, a PCU 6 includes a unit body 60, four casters 61, and two handles 62. A plurality of feeders 42 for each device pallet 5 are mounted to the unit body 60. The plurality of feeders 42 for each device pallet 5 are mounted to the electronic component mounting machine 1a.

It is assumed that the same production line L is used to continuously produce a first type of boards 90 and a second type of boards 90. It is preferable to prepare for the production of the second type of boards 90 while the first type of boards 90 are being produced, in order to reduce downtime caused by a setup operation.

In the method for individually replacing the feeders 42, as the production preparation process, the reel 41, around which the tape 40 including the electronic components required to produce the second type of boards 90 is wound, can be provided in advance in the feeder 42 which is not used to produce the first type of boards 90, as shown in FIG. 3.

In the method for collectively replacing all feeders 42, as the production preparation process, the reel 41, around which the tape 40 including the electronic components required to produce the second type of boards 90 is wound, can be provided in advance in the feeder 42 which is not used to produce the first type of boards 90 and the feeders 42 for each device pallet 5 can be mounted to the PCU 6 in advance, as shown in FIG. 4.

<Nozzle Replacement Method>

As shown in FIG. 2, there is a method for collectively replacing all nozzles 320 as a method for replacing the nozzles 320 in the electronic component mounting machine 1a. As described above, it is assumed that the same production line L is used to continuously produce the first type of boards 90 and the second type of boards 90. As a process of preparing for the production of the second type of boards 90 which can be performed while the first type of boards 90 are being produced, the nozzle 320 which is not used to produce the first type of boards 90 and is used to produce the second type of boards 90 can be inserted in advance into the nozzle stocker 33 which is not used to produce the first type of boards 90.

<Production Sequence Optimizing Method>

Figure 5:
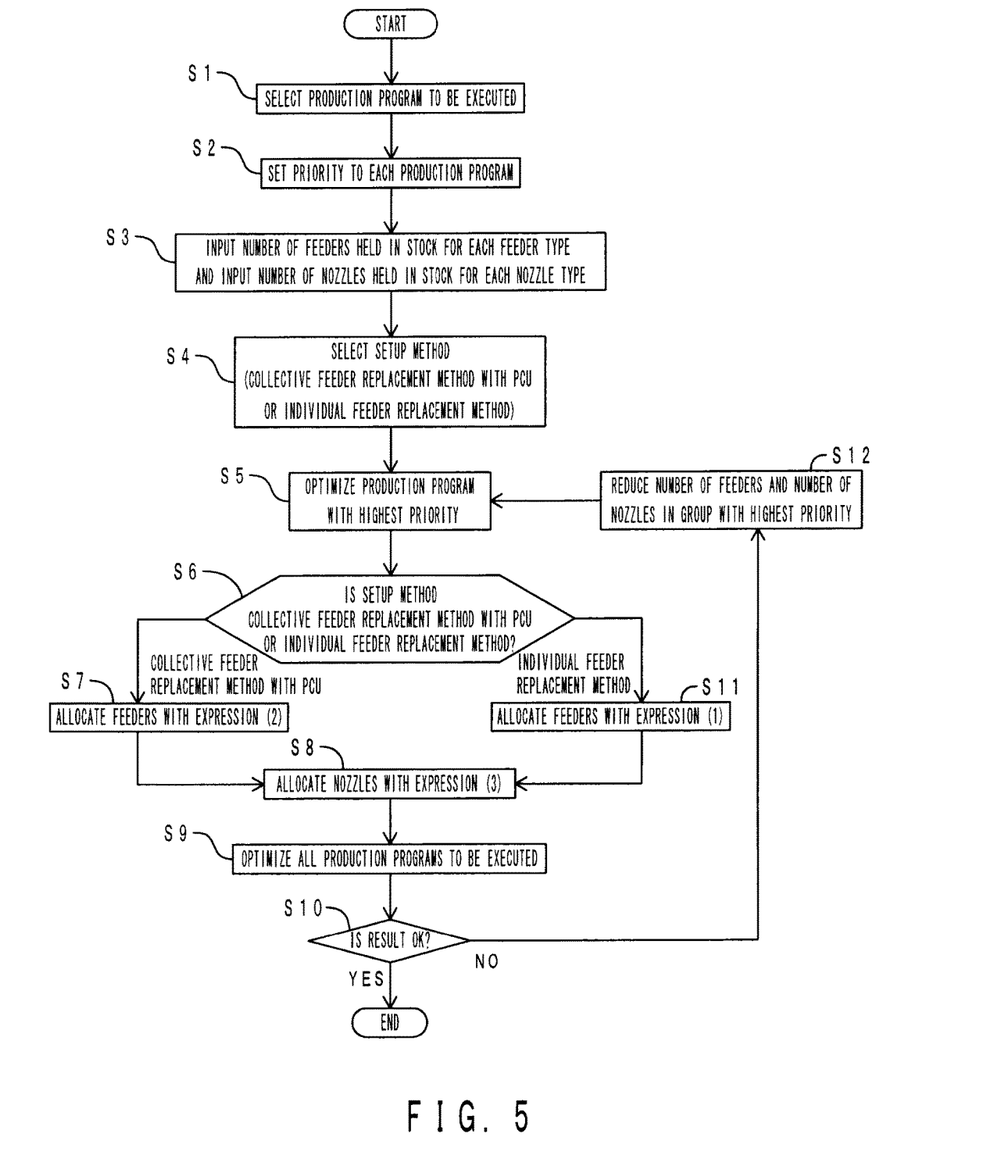
FIG. 5 is a flowchart illustrating an embodiment of a production sequence optimizing method according to the present disclosure.

Next, a production sequence optimizing method according to this embodiment will be described. The production sequence optimizing method according to this embodiment includes a production program selection step, a priority setting step, a resource counting step, a setup method selection step, a reference optimization step, and a resource allocation step. FIG. 5 is a flowchart illustrating the production sequence optimizing method according to this embodiment.

[Production Program Selection Step (S1 in FIG. 5)]

In this step, the arithmetic unit 80 of the host computer 8 shown in FIG. 1 selects a plurality of production programs which are continuously executed using the production line L among a plurality of production programs (corresponding to the types of boards 90) stored in the storage unit 81.

[Priority Setting Step](S2 in FIG. 5)

In this step, the arithmetic unit 80 sets priorities for the selected plurality of production programs. That is, the arithmetic unit 80 sets the priorities on the basis of, for example, the number of boards 90 produced or the degree of importance of the board 90.

[Resource Counting Step](S3 in FIG. 5)

In this step, the operator inputs the number of all feeders 42 held in stock to the input unit 82 of the host computer 8 shown in FIG. 1 for each type of feeder 42. In addition, the operator inputs the number of all nozzles 320 held in stock to the input unit 82 for each type of nozzle 320. The input number of feeders 42 and the input number of nozzles 320 are stored in the storage unit 81.

In this example, it is assumed that there are 100 feeders 42 of type #1 and 50 nozzles of type #1, held in stock.

[Setup Method Selection Step](S4 in FIG. 5)

In this step, the operator inputs a method for replacing the feeder 42 during setup to the input unit 82. That is, as described above, the methods for replacing the feeder 42 include a method for individually replacing the feeders 42 and a method for collectively replacing all feeders 42. In this step, the operator selects one of the replacement methods during setup.

[Reference Optimization Step](S5 in FIG. 5)

In this step, the arithmetic unit 80 optimizes the production program with the highest priority which is set in the priority setting step (S2). That is, first, the arithmetic unit 80 allocates the number of feeders 42 for each type of feeder 42 and the number of nozzles 320 for each type of nozzle 320 to the production program with the highest priority such that the cycle time is minimized when the board 90 is produced.

In this example, it is assumed that 50 feeders 42 of type #1 and 25 nozzles 320 of type #1 are allocated to the production program with the highest priority.

Then, the arithmetic unit 80 extracts another production program which can share the feeders 42 and the nozzles 320 with the optimized production program from the production programs selected in the production program selection step (S1). Then, the arithmetic unit 80 sets one group (hereinafter, referred to as a reference group) including the optimized production program and the extracted production program.

[Resource Allocation Step](S6 to S12 in FIG. 5)

In this step, the arithmetic unit 80 allocates the number of feeders 42 and the number of nozzles 320 to another production program on the basis of the number of feeders 42 and the number of nozzles 320 allocated to the production program (that is, the reference group) with the highest priority in the reference optimization step (S5).

That is, the arithmetic unit 80 allocates the number of feeders 42 for each type of feeder 42 and the number of nozzles 320 for each type of nozzle 320 to all the production programs selected in the production program selection step (S1).

(Process of Allocating Feeders 42 when Method for Individually Replacing Feeders 42 is Selected (S6 and S11))

In the setup method selection step (S4), when the method for individually replacing the feeders 42 is selected (S6), the arithmetic unit 80 allocates the feeders 42 to each group using the following Expression (1) (S11):

$$X0 - X1 + X3 \geq X2 \quad \text{Expression (1)}$$

(where $X0$ is the number of all feeders 42 of an arbitrary type, $X1$ is the number of feeders 42 required for an N-th (N is a natural number) group, $X2$ is the number of feeders 42 required for an (N+1)-th group, and $X3$ is the number of feeders 42 shared by the N-th group and the (N+1)-th group).

Figure 6:
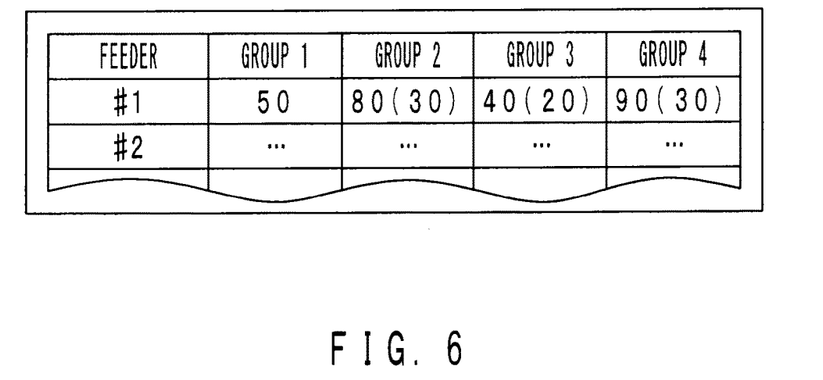
FIG. 6 is a schematic diagram illustrating a feeder allocation operation when a method for individually replacing feeders is selected.

FIG. 6 is a schematic diagram illustrating a feeder allocation operation when the method for individually replacing the feeders is selected. For example, in the case of the feeders 42 of type #1, there are 100 feeders 42 held in stock (S3). Therefore, in Expression (1), $X0$ is 100.

In this example, it is assumed that group 1 is the reference group. In this case, it has been determined in the reference optimization step (S5) that 50 feeders 42 are needed. Therefore, in Expression (1), $X1$ is 50. When the number of shared feeders 42 ($X3$) is set to 30, $X0$ (=100)−$X1$ (=50)+$X3$ (=30)≥$X2$, that is, 80≥$X2$ is satisfied from Expression (1). In other words, the number of feeders 42 in group 2 which follows group 1 is equal to or less than 80.

Similarly, the number of feeders 42 ($X2$) in group 3 is calculated with Expression (1) using the number of feeders 42 held in stock ($X0$=100), the number of feeders 42 ($X1$) in group 2, and the number of shared feeders 42 ($X3$). Similarly, the number of feeders 42 ($X2$) in group 4 is calculated with Expression (1) using the number of feeders 42 held in stock ($X0$=100), the number of feeders 42 ($X1$) in group 3, and the number of shared feeders 42 ($X3$).

As such, the number of feeders 42 is set such that Expression (1) is established between group 1 and group 2, between group 2 and group 3, and between group 3 and group 4. In this case, it is possible to reduce downtime caused by the replacement of the feeders 42 during setup. For example, in FIG. 6, when group 1 is being produced, 50 feeders 42 are used for production. However, among the 100 feeders 42 held in stock, 50 feeders 42 are not used and remain. Therefore, as shown in FIG. 3, the reels 41 (that is, the tapes 40) for group 2 can be arranged in the 50 feeders 42 used in group 2 in advance outside the production line L. In addition, among the 50 feeders 42 which are being used, 30 feeders 42 can be used to produce group 2. Therefore, it is possible to perform the setup operation in a short amount of time when production is switched from group 1 to group 2. That is, it is possible to reduce downtime.

The reference group is not limited to the first group 1. For example, when the reference group is group 2, the number of feeders 42 ($X2$) in group 3 is calculated with Expression (1) using the number of feeders 42 held in stock ($X0$=100), the number of feeders 42 ($X1$) in group 2, and the number of shared feeders 42 ($X3$). The number of feeders 42 (in this case, $X1$) in group 1 is calculated with Expression (1) using the number of feeders 42 held in stock ($X0$=100), the number of feeders 42 ($X2$) in group 2, and the number of shared feeders 42 ($X3$).

The arithmetic unit 80 allocates other feeders 42 of type #2 to each of groups 1 to 4, similarly to the feeders 42 of type #1.

(Process of Allocating Feeders 42 when Method for Collectively Replacing All Feeders 42 is Selected (S6 and S7))

In the setup method selection step (S4), when the method for collectively replacing all feeders 42 is selected (S6), the arithmetic unit 80 allocates the feeders 42 to each group using the following Expression (2) (S7):

$$X1 + X2 \leq X0 \quad \text{Expression (2)}$$

(where $X0$ is the number of all feeders 42 of an arbitrary type, $X1$ is the number of feeders 42 required for an N-th group, and $X2$ is the number of feeders 42 required for an (N+1)-th group).

Figure 7:
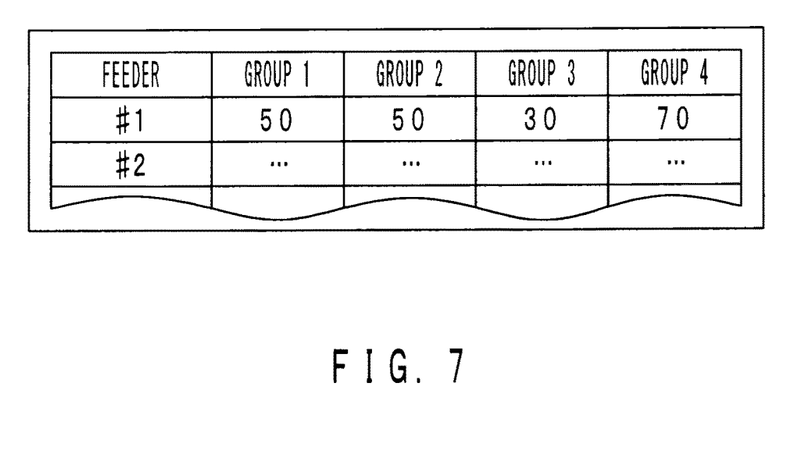
FIG. 7 is a schematic diagram illustrating a feeder allocation operation when a method for collectively replacing all feeders is selected.

FIG. 7 is a schematic diagram illustrating a feeder allocation operation when the method for collectively replacing all feeders is selected. For example, in the case of the feeders 42 of type #1, there are 100 feeders 42 held in stock (S3). Therefore, in Expression (2), $X0$ is 100.

In this example, it is assumed that group 1 is the reference group. In this case, it has been determined in the reference optimization step (S5) that 50 feeders 42 are needed. Therefore, in Expression (2), $X1$ is 50. Thus, $X2 \leq X0$ (=100)−$X1$ (=50), that is, $X2 \leq 50$ is satisfied from Expression (2). That is, the number of feeders 42 in group 2 which follows group 1 is equal to or less than 50.

Similarly, the number of feeders 42 ($X2$) in group 3 is calculated with Expression (2) using the number of feeders 42 held in stock ($X0$=100) and the number of feeders 42 ($X1$) in group 2. Similarly, the number of feeders 42 ($X2$) in group 4 is calculated with Expression (2) using the number of feeders 42 held in stock ($X0$=100) and the number of feeders 42 ($X1$) in group 3.

As such, the number of feeders 42 is set such that Expression (2) is established between group 1 and group 2, between group 2 and group 3, and between group 3 and group 4. In this case, it is possible to reduce downtime caused by the replacement of the feeders 42 during setup. For example, in FIG. 7, when group 1 is being produced, 50 feeders 42 are used for production. However, among the 100 feeders 42 held in stock, 50 feeders 42 are not used and remain. Therefore, as shown in FIG. 4, the 50 feeders 42 used in group 2 (in which the tapes 40 for group 2 are arranged) can be mounted in the PCU 6 in advance outside the production line L. Therefore, it is possible to perform the setup operation in a short amount of time when production is switched from group 1 to group 2. That is, it is possible to reduce downtime.

The reference group is not limited to the first group 1. For example, when the reference group is group 2, the number of feeders 42 (X2) in group 3 is calculated with Expression (2) using the number of feeders 42 held in stock (X0=100) and the number of feeders 42 (X1) in group 2. The number of feeders 42 (in this case, X1) in group 1 is calculated with Expression (2) using the number of feeders 42 held in stock (X0=100) and the number of feeders 42 (in this case, X2) in group 2.

The arithmetic unit 80 allocates other feeders 42 of type #2 to each of groups 1 to 4, similarly to the feeders 42 of type #1.

(Process of Allocating Nozzles 320 (S8))

The arithmetic unit 80 allocates the nozzles 320 to each group using the following Expression (3) (S8):

$$Y1+Y2 \leq Y0 \quad \text{Expression (3)}$$

(where Y0 is the number of all nozzles 320 of an arbitrary type, Y1 is the number of nozzles 320 required for an N-th group, and Y2 is the number of nozzles 320 required for an (N+1)-th group).

Figure 8:
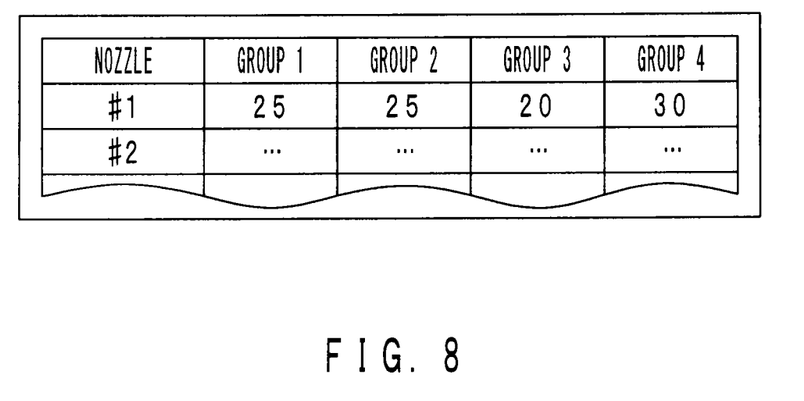
FIG. 8 is a schematic diagram illustrating a nozzle allocation operation.

FIG. 8 is a schematic diagram illustrating a nozzle allocation operation. For example, in the case of the nozzles 320 of type #1, the number of nozzles 320 held in stock is 50 (S3). Therefore, in Expression (3), Y0 is 50.

In this example, it is assumed that group 1 is the reference group. In this case, it has been determined in the reference optimization step (S5) that 25 nozzles 320 are needed. Therefore, in Expression (3), Y1 is 25. Thus, Y2≤Y0 (=50)−Y1 (=25), that is, Y2≤25 is satisfied from Expression (3). That is, the number of nozzles 320 in group 2 which follows group 1 is equal to or less than 25.

Similarly, the number of nozzles 320 (Y2) in group 3 is calculated with Expression (3) using the number of nozzles 320 held in stock (Y0=50) and the number of nozzles 320 (Y1) in group 2. Similarly, the number of nozzles 320 (Y2) in group 4 is calculated with Expression (3) using the number of nozzles 320 held in stock (Y0=50) and the number of nozzles 320 (Y1) in group 3.

As such, the number of nozzles 320 is set such that Expression (3) is established between group 1 and group 2, between group 2 and group 3, and between group 3 and group 4. In this case, it is possible to reduce downtime caused by the replacement of the nozzles 320 during setup. For example, in FIG. 8, when group 1 is being produced, 25 nozzles 320 are used for production. However, among the 50 nozzles 320 held in stock, 25 nozzles 320 are not used and remain. Therefore, as shown in FIG. 2, the 25 nozzles 320 used in group 2 can be inserted into the nozzle stocker 33 in advance outside the production line L. Therefore, it is possible to perform the setup operation in a short amount of time when production is switched from group 1 to group 2. That is, it is possible to reduce downtime.

The reference group is not limited to the first group 1. For example, when the reference group is group 2, the number of nozzles 320 (Y2) in group 3 is calculated with Expression (3) using the number of nozzles 320 held in stock (Y0=50) and the number of nozzles 320 (Y1) in group 2. The number of nozzles 320 (in this case, Y1) in group 1 is calculated with Expression (3) using the number of nozzles 320 held in stock (Y0=50) and the number of nozzles 320 (in this case, Y2) in group 2.

The arithmetic unit 80 allocates other nozzles 320 of type #2 to each of groups 1 to 4, similarly to the nozzles 320 of type #1.

Then, the arithmetic unit 80 optimizes all of the production programs to be executed (S9). When the optimization result is appropriate, the process ends (S10).

On the other hand, when the optimization result is not appropriate, the arithmetic unit 80 reduces the number of feeders 42 and the number of nozzles 320 arranged in the group having the production program with the highest priority (S12). In this case, when a plurality of feeders 42 including the same electronic components are arranged or when a plurality of nozzles 320 of the same type are arranged, the arithmetic unit 80 reduces the number of feeders 42 arranged and the number of nozzles 320 arranged. Then, the arithmetic unit 80 performs the reference optimization step (S5) again.

<Operation and Effect>

Next, the operation and effect of the production sequence optimizing method and the production sequence optimizing system according to this embodiment will be described. According to the production sequence optimizing method and the production sequence optimizing system 9 of this embodiment, it is possible to optimize the execution order of a plurality of production programs, considering the number of feeders 42 held in stock and the number of nozzles 320 held in stock, as shown in FIG. 5. That is, when production is switched from the N-th group to the (N+1)-th group, the feeders 42 and the nozzles 320 are allocated to each group such that the setup operation is performed outside the production line if possible. Therefore, according to the production sequence optimizing method and the production sequence optimizing system 9 of this embodiment, it is possible to reduce downtime caused by the setup operation.

In addition, according to the production sequence optimizing method and the production sequence optimizing system 9 of this embodiment, when the feeders 42 are individually replaced in the electronic component mounting machines 1a to 1d as shown in FIG. 5, it is possible to reduce downtime caused by the setup operation.

According to the production sequence optimizing method and the production sequence optimizing system 9 of this embodiment, when the feeders 42 are collectively replaced in the electronic component mounting machines 1a to 1d as shown in FIG. 5, it is possible to reduce downtime caused by the setup operation.

According to the production sequence optimizing method and the production sequence optimizing system 9 of this embodiment, when the nozzles 320 are replaced in the electronic component mounting machines 1a to 1d as shown in FIG. 5, it is possible to reduce downtime caused by the setup operation.

According to the production sequence optimizing method and the production sequence optimizing system 9 of this embodiment, the feeders 42 and the nozzles 320 can be first allocated to the production program with the highest priority, as shown in FIG. 5. Then, it is possible to allocate the feeders 42 and the nozzles 320 to each group on the basis of the production program.

<Others>

The embodiments of the production sequence optimizing method and the production sequence optimizing system according to the present disclosure have been described above. However, the embodiments are not particularly limited to the above-mentioned structures. The present disclosure can include various modifications and improvements which can be made by those skilled in the art.

For example, the type of resources is not particularly limited. The resources may be trays on which the electronic components are mounted. In addition, a method for allocating the resources is not particularly limited.

Figure 9:
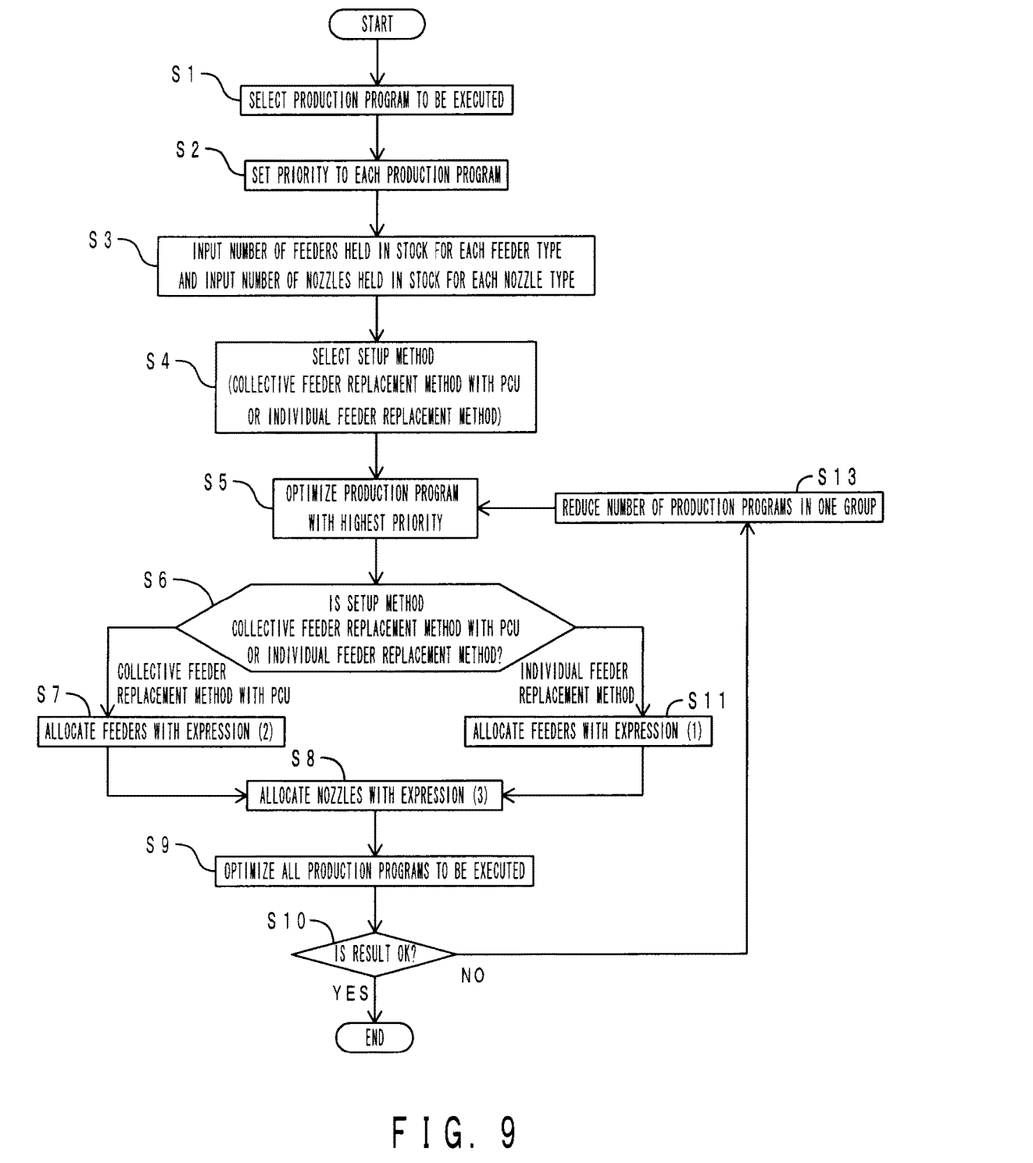
FIG. 9 is a flowchart illustrating another embodiment of the production sequence optimizing method according to the present disclosure.

FIG. 9 is a flowchart illustrating another embodiment of the production sequence optimizing method according to the present disclosure. In FIG. 9, components corresponding to those shown in FIG. 5 are denoted by the same reference numerals. As shown in FIG. 5, in the above-described embodiment, when the optimization result is not appropriate, the number of feeders 42 and the number of nozzles 320 arranged in the group with the highest priority are reduced (S12). However, as shown in FIG. 9, the number of production programs in one group may be reduced (S13). That is, it is preferable to maximize the number of production programs included in the same group, in order to improve the efficiency of the setup operation. However, in this case, the number of feeders 42 and the number of nozzles 320 required for one group increase. Therefore, when the optimization result is not appropriate, the number of production programs in one group may be reduced and the reference optimization step (S5) may be performed again.

The invention claimed is:

1. A production sequence optimizing method that classifies a plurality of production programs which are continuously executed using a production line into a plurality of groups which share resources used for production and that optimizes an execution order of the plurality of production programs, comprising:
   a resource number counting step of counting a number of all resources held in stock; and
   a resource allocation step of, in a case where the number of all resources is less than a sum of a number of resources required for an N-th group and a number of resources required for an (N+1)-th group where N is a natural number, allocating the resources to each of the groups on the basis of the number of all resources, the number of resources required for the N-th group, and the number of resources required for the (N+1)-th group, wherein
   the resources include feeders, each including a tape having electronic components and being detachably provided in an electronic component mounting machine,
   when the feeders are individually replaced in the electronic component mounting machine in a first setup operation, the feeders are allocated to each of the groups in the resource allocation step in a first manner, and
   when the feeders are collectively replaced in the electronic component mounting machine in a second setup operation different from the first setup operation, the feeders are allocated to each of the groups in the resource allocation step in a second manner different from the first manner.

2. The production sequence optimizing method according to claim 1, wherein, in the first manner,
   the feeders are allocated to each of the groups in the resource allocation step using the following Expression (1):

$$X0-X1+X3 \geq X2 \qquad \text{Expression (1),}$$

where X0 is a number of all feeders, X1 is a number of feeders required for the N-th group, X2 is a number of feeders required for the (N+1)-th group, and X3 is a number of feeders shared by the N-th group and the (N+1)-th group.

3. The production sequence optimizing method according to claim 1, wherein, in the second manner,
   the feeders are allocated to each of the groups in the resource allocation step using the following Expression (2):

$$X1+X2 \leq X0 \qquad \text{Expression (2),}$$

where X0 is a number of all feeders, X1 is a number of feeders required for the N-th group, and X2 is a number of feeders required for the (N+1)-th group.

4. The production sequence optimizing method according to claim 1, wherein
   the resources further include nozzles, each being detachably provided in the electronic component mounting machine and configured to transfer an electronic component, and
   the nozzles are allocated to each of the groups in the resource allocation step using the following Expression (3):

$$Y1+Y2 \leq Y0 \qquad \text{Expression (3),}$$

where Y0 is a number of all nozzles, Y1 is a number of nozzles required for the N-th group, and Y2 is a number of nozzles required for the (N+1)-th group.

5. The production sequence optimizing method according to claim 1, further comprising:
   a reference optimization step of allocating the resources to a production program with a highest priority among the plurality of production programs such that a cycle time is shortened before the resource allocation step.

6. The production sequence optimizing method according to claim 5, further comprising:
   reducing a number of the resources in a group that includes the production program with the highest priority when the resource allocation is not appropriate.

7. The production sequence optimizing method according to claim 1, further comprising:
   reducing a number of production programs in one group when the resource allocation is not appropriate.

8. A production sequence optimizing system comprising:
   a production line including an electronic component mounting machine configured to put electronic components on a board; and
   a control device that classifies a plurality of production programs which are continuously executed using the production line into a plurality of groups which share resources used for production and optimizes an execution order of the plurality of production programs,
   wherein the control device is configured to perform:
      a resource number counting step of counting a number of all resources held in stock; and
      a resource allocation step of, in a case where the number of all resources is less than a sum of a number of resources required for an N-th group and a number of resources required for an (N+1)-th group where N is a natural number, allocating the resources to each of the groups on the basis of the number of all resources, the number of resources required for the N-th group, and the number of resources required for the (N+1)-th group, wherein
      the resources include feeders, each including a tape having the electronic components and being detachably provided in the electronic component mounting machine,
      when the feeders are individually replaced in the electronic component mounting machine in a first setup operation, the feeders are allocated to each of the groups in the resource allocation step in a first manner, and
      when the feeders are collectively replaced in the electronic component mounting machine in a second setup operation different from the first setup operation, the feeders are allocated to each of the groups in the resource allocation step in a second manner different from the first manner.

9. The production sequence optimizing system according to claim 8, wherein, in the first manner,
the control device allocates the feeders to each of the groups in the resource allocation step using the following Expression (1):

$$X0-X1+X3 \geq X2 \qquad \text{Expression (1)},$$

where X0 is a number of all feeders, X1 is a number of feeders required for the N-th group, X2 is a number of feeders required for the (N+1)-th group, and X3 is a number of feeders shared by the N-th group and the (N+1)-th group.

10. The production sequence optimizing system according to claim 8, wherein, in the second manner,
the control device allocates the feeders to each of the groups in the resource allocation step using the following Expression (2):

$$X1+X2 \leq X0 \qquad \text{Expression (2)},$$

where X0 is a number of all feeders, X1 is a number of feeders required for the N-th (N is a natural number) group, and X2 is a number of feeders required for the (N+1)-th group.

11. The production sequence optimizing system according to claim 8, wherein
the resources further include nozzles, each being detachably provided in the electronic component mounting machine and configured to transfer the electronic components, and
the control device allocates the nozzles to each of the groups in the resource allocation step using the following Expression (3):

$$Y1+Y2 \leq Y0 \qquad \text{Expression (3)},$$

where Y0 is a number of all nozzles, Y1 is a number of nozzles required for the N-th group, Y2 is a number of nozzles required for the (N+1)-th group.

12. The production sequence optimizing system according to claim 8, wherein the control device performs a reference optimization step of allocating the resources to a production program with a highest priority among the plurality of production programs such that a cycle time is shortened before the resource allocation step.

13. The production sequence optimizing system according to claim 12, wherein the control device reduces a number of the resources in a group that includes the production program with the highest priority when the resource allocation is not appropriate.

14. The production sequence optimizing system according to claim 8, wherein the control device reduces a number of production programs in one group when the resource allocation is not appropriate.

* * * * *